(12) United States Patent
Cambou

(10) Patent No.: US 10,062,833 B2
(45) Date of Patent: Aug. 28, 2018

(54) ELECTRICAL INTERCONNECTING DEVICE FOR MRAM-BASED MAGNETIC DEVICES

(71) Applicant: CROCUS Technology SA, Grenoble (FR)

(72) Inventor: Bertrand Cambou, Palo Alto, CA (US)

(73) Assignee: CROCUS TECHNOLOGY SA, Grenoble (FR)

( * ) Notice: Subject to any disclaimer, the term of this patent is extended or adjusted under 35 U.S.C. 154(b) by 0 days.

(21) Appl. No.: 15/516,079

(22) PCT Filed: Sep. 24, 2015

(86) PCT No.: PCT/EP2015/072031
§ 371 (c)(1),
(2) Date: Mar. 31, 2017

(87) PCT Pub. No.: WO2016/050615
PCT Pub. Date: Apr. 7, 2016

(65) Prior Publication Data
US 2017/0309812 A1    Oct. 26, 2017

Related U.S. Application Data

(60) Provisional application No. 62/059,337, filed on Oct. 3, 2014.

(51) Int. Cl.
*H01L 43/02* (2006.01)
*G11C 11/16* (2006.01)
(Continued)

(52) U.S. Cl.
CPC ............ *H01L 43/02* (2013.01); *G11C 11/161* (2013.01); *G11C 11/1673* (2013.01);
(Continued)

(58) Field of Classification Search
CPC .......... H01L 43/02; H01L 43/08; H01L 43/10; H01L 43/12; H01L 27/222; G11C 11/161; G11C 11/1673
See application file for complete search history.

(56) References Cited

U.S. PATENT DOCUMENTS

2004/0150016 A1* 8/2004 Ooishi .................. B82Y 10/00
257/295
2010/0187591 A1   7/2010 Nagashima
(Continued)

FOREIGN PATENT DOCUMENTS

| EP | 1333486 A2 | 8/2003 |
| JP | 2013033573 A | 2/2013 |
| WO | 03079366 A2 | 9/2003 |

OTHER PUBLICATIONS

International Search Report for PCT/EP2015/072031 dated Dec. 10, 2015.
Written Opinion for PCT/EP2015/072031 dated Dec. 10, 2015.

*Primary Examiner* — Cheung Lee
*Assistant Examiner* — Stephen C Smith
(74) *Attorney, Agent, or Firm* — Pearne & Gordon LLP

(57) ABSTRACT

A MRAM-based magnetic device including an electrical interconnecting device including: a magnetic tunnel junction; a strap portion electrically connecting a lower end of the magnetic tunnel junction; a current line portion electrically connecting an upper end of the magnetic tunnel junction; an upper metallic stud electrically connecting a lower metallic stud through a via; the strap portion being in direct electrical contact with the via, such that a current passing in the magnetic tunnel junction flows directly between the strap portion and the via and between the via and the lower metallic stud or the upper metallic stud.

10 Claims, 3 Drawing Sheets

(51) Int. Cl.
*H01L 43/12* (2006.01)
*H01L 43/08* (2006.01)
*H01L 27/22* (2006.01)
*H01L 43/10* (2006.01)

(52) U.S. Cl.
CPC ............ *H01L 27/222* (2013.01); *H01L 43/08* (2013.01); *H01L 43/10* (2013.01); *H01L 43/12* (2013.01)

(56) References Cited

U.S. PATENT DOCUMENTS

| | | | |
|---|---|---|---|
| 2011/0002151 A1* | 1/2011 | Javerliac | G11C 15/02 365/50 |
| 2011/0008915 A1 | 1/2011 | Nozieres et al. | |
| 2011/0062539 A1* | 3/2011 | Matsuda | B82Y 25/00 257/422 |
| 2012/0201073 A1 | 8/2012 | Berger et al. | |

\* cited by examiner

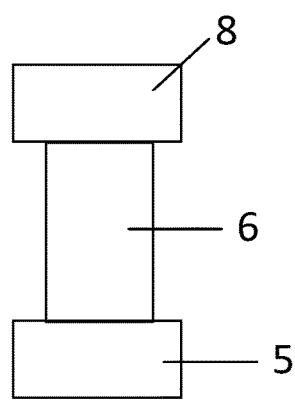
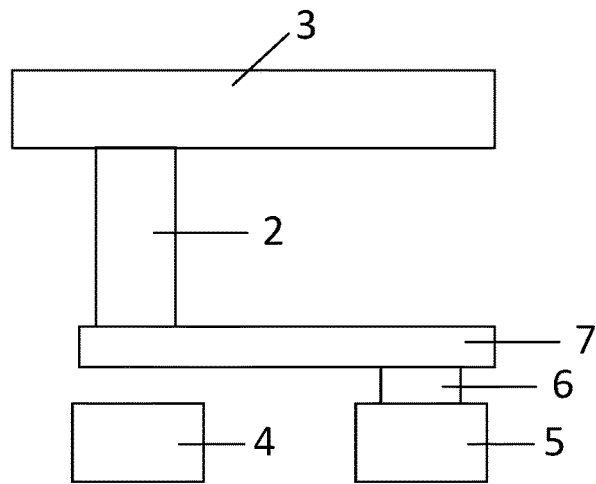
Fig. 1 (prior art)
Fig. 2 (prior art)
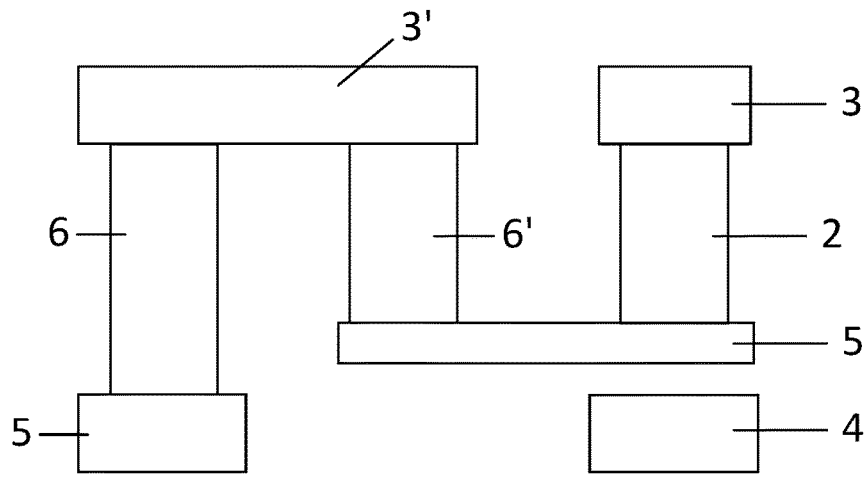
Fig. 3 (prior art)

ELECTRICAL INTERCONNECTING DEVICE FOR MRAM-BASED MAGNETIC DEVICES

FIELD

The present invention concerns an electrical interconnecting device for connecting a MRAM-based magnetic device having low defect and smaller size. The present invention further concerns a method for manufacturing the interconnecting device.

DESCRIPTION OF RELATED ART

In semiconductor back-end processing metal wiring layers, separated by a dielectric are electrically interconnected using vias, i.e. metal pillars that connect on level to metal to and adjacent one. FIG. 1 shows an example of a typical implementation of an interconnection including a via 6 extending downwardly from an upper metallic stud 8 toward a lower metallic stud 5.

In MRAM technologies, including magnetic logic units (MLU), the magnetic tunnel junction 2 is often placed on a local interconnect referred to as strap 7 (see FIG. 2). This is typically made of a refractory metal such as Ta, or W but can also contain other metals. Often, the strap 7 is close to a metallic field line 4 below to obtain higher magnetic fields when a current is passed in the field line 4.

However, such vias extending downwardly often gives rise to processing difficulties and high defectivity related to shallow vias and thin dielectric layers below.

FIG. 3 shows an interconnection for a standard MLU type cell comprising the magnetic tunnel junction 2 connected between a current line 3 and a strap 7. The strap is electrically connected to a lower metallic stud 5 in series through a via portion 6' extending upwards to a current line portion 3' and through the via 6.

The configuration of the interconnection of FIG. 3 yields better processing performances but to a larger cell size for the magnetic element.

SUMMARY

In the present disclosure, an alternative via technology which makes electrical connection between the strap and the metal below using a via coming from the metal above the strap is described.

The present disclosure concerns an electrical interconnecting device comprising: a magnetic tunnel junction; a strap portion electrically connecting a lower end of the magnetic tunnel junction; a current line portion electrically connecting an upper end of the magnetic tunnel junction; an upper metallic stud electrically connecting a lower metallic stud through a via; wherein the strap portion is in direct electrical contact with the via, such that a current passing in the magnetic tunnel junction flows directly between the strap portion and the via and between the via and the lower metallic stud or the upper metallic stud.

The present disclosure further concerns a MRAM-based magnetic device comprising an interconnecting device and a plurality of MRAM cells; each MRAM cell comprising a magnetic tunnel junction; a junction strap electrically connecting a lower end of the magnetic tunnel junction; a current line electrically connecting an upper end of the magnetic tunnel junction; and a field line for passing a sense current the field line being arranged below the lower end of the magnetic tunnel junction; the magnetic tunnel junction of one MRAM cell being electrically connected in series with the magnetic tunnel junction of another MRAM cell through the current line and the junction strap; wherein the strap portion of the interconnecting device electrically connects the junction strap of one of the plurality of MRAM cells.

The present disclosure also pertains to a method for manufacturing an interconnecting device comprising the steps of: forming the lower metallic stud; forming the strap portion; forming the via and the magnetic tunnel junction; and forming the upper metallic stud and the current line portion.

The electrical interconnecting device disclosed herein and the MRAM-based magnetic device comprising an interconnecting device can be manufactured with lower defect compared with the manufacturing of interconnecting devices. It also allows for simple processing to be combined with advantageous cell size of the MRAM-based magnetic device.

BRIEF DESCRIPTION OF THE DRAWINGS

The disclosure will be better understood with the aid of the description of an embodiment given by way of example and illustrated by the figures, in which:

FIG. 1 shows a conventional interconnection;

FIG. 2 illustrates a conventional local interconnection for a MRAM cell;

FIG. 3 shows an interconnection for a standard MLU type cell;

DETAILED DESCRIPTION OF POSSIBLE EMBODIMENTS OF THE INVENTION

Figure 4:
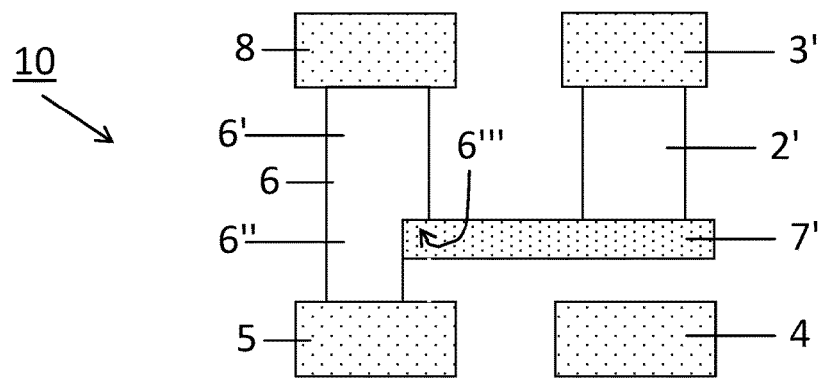
FIG. 4 represents an electrical interconnecting device according to an embodiment.

An electrical interconnecting device 10 is represented in FIG. 4 according to an embodiment. The interconnecting device 10 comprises a magnetic tunnel junction 2', a strap portion 7' electrically connecting a lower end of the magnetic tunnel junction 2', a current line portion 3' electrically connecting an upper end of the magnetic tunnel junction 2', and an upper metallic stud 8 electrically connecting a lower metallic stud 5 through a via 6. The strap portion 7' is in direct electrical contact with the via 6, such that a current passing in the magnetic tunnel junction 2' flows directly between the strap portion 7' and the via 6 and between the via 6 and the lower metallic stud 5 or the upper metallic stud 8.

The strap portion 7', upper metallic stud 8, lower metallic stud 5 and current line portion 3' comprises an electrically conductive material such as a metallic material. The strap portion 7' can also comprise a refractory metal such as Ta, or W. In a variant, the strap portion 7' can have a sheet resistance above 200 O/square such that it can further be used for local heating of the magnetic tunnel junction 2' when a current is passed in the strap portion 7'. This can be achieved by the strap portion 7' having a reduced cross section. This can also be achieved, alternatively or in combination with the smaller cross section, by utilizing a resistive material for the strap portion 7'. For example, the two strap portion 7', normally made of tantalum having a sheet resistance of 106 O/square, can be made of tantalum nitride having a sheet resistance above 200 O/square In an embodiment, the strap portion 7' is arranged to contact the via 6 in an interlocked manner. In the particular example of FIG. 4, the via 6 comprises an upper portion 6' having a first width and a lower portion 6" having a second width smaller than the first width. Preferably, the strap portion 7' contacts the via 6 on the lower via portion 6" at the intersection with the upper via portion 6'. In this configuration, the strap portion 7' contacts the side of the lower via portion 6" and an undercut 6''' formed at the intersection of the upper via portion 6' and the lower via portion 6". This configuration allows for increasing the surface area of the contact between the via 6 and the strap portion 7' and ensures better electrical contact than if the strap portion 7' contact the via 6 only on one of its sides.

In an embodiment not represented, the interconnecting device 10 further comprises a transistor electrically connected to the lower metallic stud 5.

FIG. 5 illustrates a method for manufacturing the interconnecting device 10 according to an embodiment and comprising the steps of:

forming the lower metallic stud 5;
forming the strap portion 7';
forming the via 6 and the magnetic tunnel junction 2'; and
forming the upper metallic stud 8 and the current line portion 3'.

Figure 5A:
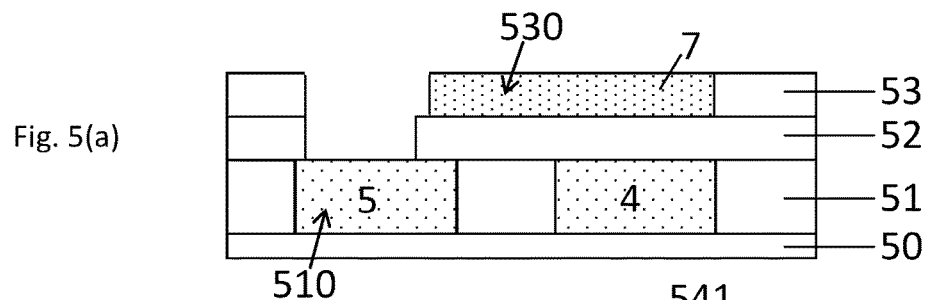
FIGS. 5(a)-5(c) illustrate a method for manufacturing the interconnecting device, according to an embodiment.

As shown in FIG. 5a, a first dielectric layer 51 is first deposited on a substrate 50 and a lower stud trench 510 is provided in the first dielectric layer 51, for example by etching. The lower metallic stud 5 is then deposited in the lower stud trench (510).

Figure 5B:
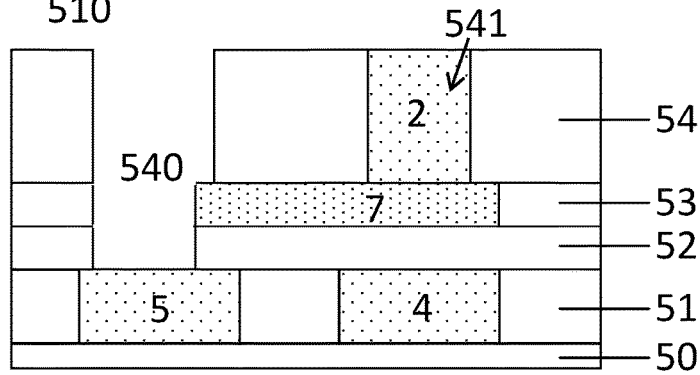

FIG. 5b shows the deposition of a second dielectric layer 52 on the first dielectric layer 51 and of a third dielectric layer 53 on the second dielectric layer 52. A strap trench 530 is etched away in the third dielectric layer 53 and the strap portion 7' is then deposited in the strap trench 530.

Figure 5C:
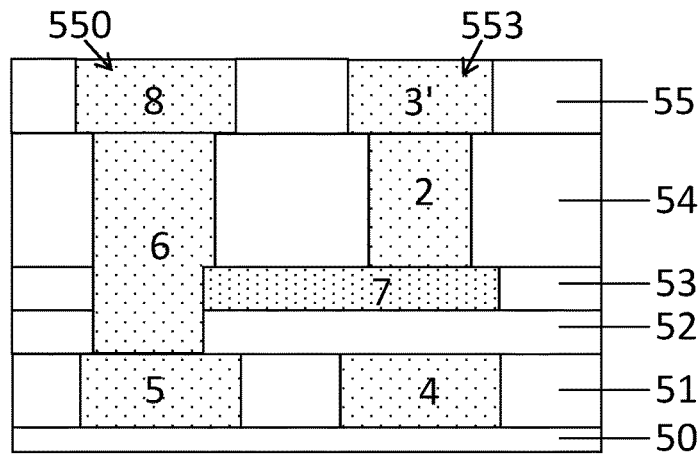

FIG. 5c shows the deposition of a fourth dielectric layer 54 on top of the third dielectric layer 53 and the forming of a via trench 540 in the fourth dielectric layer 54. The via 6 is then deposited in the via trench 540. The via trench 540 is etched in a position that is aligned with the lower metallic stud 5 such that when the via 6 is deposited, it is in electrical contact with the metallic stud 5.

The manufacturing method further comprises forming a junction trench 541 in the fourth dielectric layer 54 and depositing the magnetic tunnel junction 2' in the junction trench 541. The junction trench 541 is etched such as to be aligned with the strap portion 7' such that when the magnetic tunnel junction 2' is deposited it is in electrical contact with the strap portion 7'.

The manufacturing method can further comprise a planarizing step after depositing one of the dielectric layers 51-55.

The manufacturing method further comprises depositing a fifth dielectric layer 55 on top of the fourth dielectric layer 54 and forming an upper stud trench 550 aligned with the lower metallic stud 5. The upper metallic stud 8 is then deposited in the upper stud trench 550 such as to be in electrical contact with the via 6. A line trench 553 can also be etched in the fifth dielectric layer 55 and the current line portion 3' is deposited in the line trench 553. The line trench 553 is in alignment with the magnetic tunnel junction 2' such that the deposited current line portion 3' is in electrical contact with the magnetic tunnel junction 2'.

The dielectric layers 51-55 can comprise one or more layers of a dielectric such as silicon oxide or low-k dielectric materials.

Figure 6:
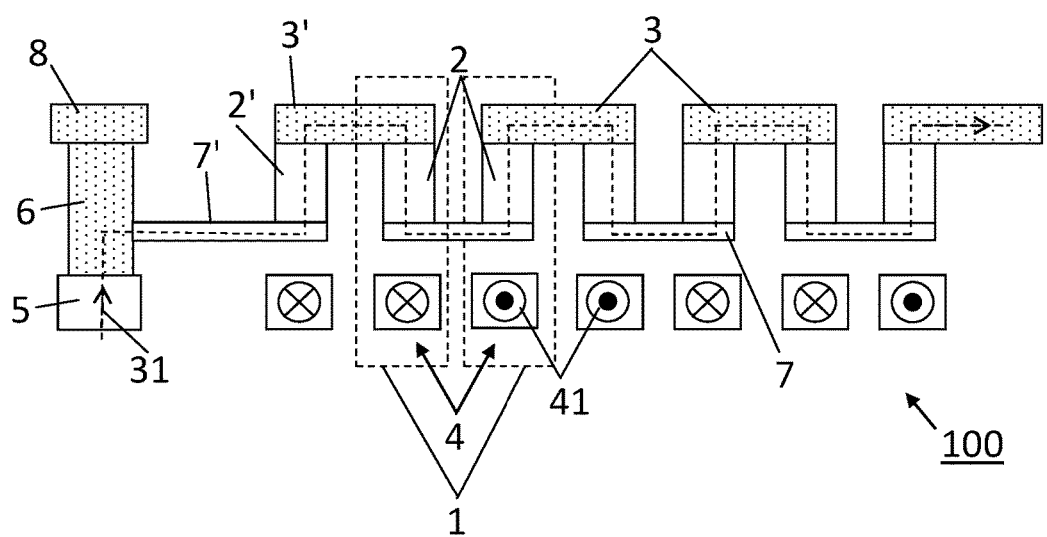
FIG. 6 shows a magnetic device comprising the interconnecting device and a plurality of MRAM cells, according to an embodiment.

In an embodiment illustrated in FIG. 6, a MRAM based magnetic device 100 comprises the interconnecting device 10 and a plurality of MRAM cells 1. Each MRAM cell 1 comprises a magnetic tunnel junction 2; a junction strap 7 electrically connecting a lower end of the magnetic tunnel junction 2; a current line 3, for passing a current 31, electrically connecting an upper end of the magnetic tunnel junction 2; and a field line 4 for passing a sense current 41 the field line 4 being arranged below the lower end of the magnetic tunnel junction 2. The magnetic tunnel junction 2 of one MRAM cell 1 is electrically connected in series with the magnetic tunnel junction 2 of another MRAM cell 1 through the current line 3 and the junction strap 7. The strap portion 7' of the interconnecting device 10 electrically connects the junction strap 7' of one of the MRAM cells 1.

The magnetic tunnel junction 2, 2 can comprise a sense layer 21 having a sense magnetization 210, a storage layer 23 having a storage magnetization, and a tunnel barrier layer 22 separating the sense magnetic layer 21 from the storage magnetic layer 23. The sense magnetization 210 can be reversible and the storage magnetization 230 can be adjustable when the magnetic tunnel junction 2 is at a high temperature threshold and pinned at a low temperature threshold. The magnetic tunnel junction 2 can further comprise an antiferromagnetic layer 24 arranged for pinning the second magnetization at a low temperature threshold and freeing it at a high temperature threshold. The current line 3 can be used to pass a heating current during a write operation or a read current during a read operation. The field line 4 can be arranged for passing a field current 41 such as to generate an external magnetic field 42 adapted for switching the storage magnetization 230 during the write operation and the sense magnetization 210 during the read operation.

The sense and storage layers can comprise a CoFe, CoFeB or NiFe alloy. The tunnel barrier layer 22 is a thin layer, typically in the nanometer range and can be formed, for example, from any suitable insulating material, such as alumina or magnesium oxide. The antiferromagnetic layer 24 can be made from a manganese-based alloy, such as IrMn, PtMn or FeMn, or any other suitable materials.

REFERENCE NUMBERS

1 MRAM cell
10 interconnecting device
100 MRAM based magnetic device
2, 2' magnetic tunnel junction
21 ferromagnetic sense layer
210 sense magnetization
22 tunnel barrier layer
23 storage layer
230 storage magnetization
3 current line
3' current line portion
31 current
4 field line
41 sense current
5 lower metallic stud
50 substrate
51 first dielectric layer
510 lower stud trench
52 second dielectric layer
53 third dielectric layer
530 strap trench 54 fourth dielectric layer
540 via trench
541 junction trench
55 fifth dielectric layer
550 upper stud trench
553 line trench
6 via
7 strap
7' strap portion
8 upper metallic stud

What is claimed is:

1. A MRAM-based magnetic device comprising an interconnecting device and a plurality of MRAM cells, wherein
each of the MRAM cells comprises a magnetic tunnel junction; a junction strap electrically connecting a lower end of the magnetic tunnel junction; a current line electrically connecting an upper end of the magnetic tunnel junction; and a field line for passing a sense current the field line being arranged below the lower end of the magnetic tunnel junction;
the magnetic tunnel junction of a second one of the MRAM cells being electrically connected in series with the magnetic tunnel junction of a first one of the MRAM cells by the current line and with the magnetic tunnel junction of a third one of the MRAM cells by the junction strap;
the interconnecting device comprises a strap portion electrically connecting a lower end of the magnetic tunnel junction of the first MRAM cell; an upper metallic stud electrically connecting a lower metallic stud through a via; wherein the strap portion is in direct electrical contact with the via, such that a current passing in said magnetic tunnel junction of the first MRAM cell flows directly between the strap portion and the via and between the via and the lower metallic stud or the upper metallic stud; wherein
the upper metallic stud and the via are aligned downwardly with the lower metallic stud, and the current line is aligned downwardly with said magnetic tunnel junction of the first MRAM; and
wherein the strap portion of only the interconnecting device electrically connects said magnetic tunnel junction of the first MRAM cells so that the interconnecting device is connected in series to the plurality of MRAM cells.

2. The MRAM-based magnetic device according to claim 1, wherein the strap portion of the electrical interconnecting device is arranged to contact the via in an interlocked manner.

3. The MRAM-based magnetic device according to claim 2 wherein the via of the electrical interconnecting device comprises an upper portion having a first width and a lower portion having a second width smaller than the first width; and
wherein the strap portion contacts the via on the lower via portion at the intersection with the upper via portion.

4. The MRAM-based magnetic device according to claim 1, further comprising a transistor electrically connected to the lower metallic stud of the interconnecting device.

5. A method for manufacturing an MRAM-based magnetic device comprising an interconnecting device and a plurality of MRAM cells, wherein each MRAM cell comprises a magnetic tunnel junction; a junction strap electrically connecting a lower end of the magnetic tunnel junction; a current line electrically connecting an upper end of the magnetic tunnel junction; and a field line for passing a sense current the field line being arranged below the lower end of the magnetic tunnel junction; the magnetic tunnel junction of a second one of the MRAM cells being electrically connected in series with the magnetic tunnel junction of a first one of the MRAM cells by the current line and with the magnetic tunnel junction of a third one of the MRAM cells by the junction strap; the interconnecting device comprises a strap portion electrically connecting a lower end of the magnetic tunnel junction of the first MRAM cell; an upper metallic stud electrically connecting a lower metallic stud through a via; wherein the strap portion is in direct electrical contact with the via, such that a current passing in said magnetic tunnel junction of the first MRAM cell flows directly between the strap portion and the via and between the via and the lower metallic stud or the upper metallic stud, wherein the upper metallic stud and the via are aligned downwardly with the lower metallic stud, and the current line portion is aligned downwardly with said magnetic tunnel junction of one of the MRAM cells;
the method comprising, in this sequence:
forming the lower metallic stud;
forming the strap portion;
forming the via and the magnetic tunnel junction; and
forming the upper metallic stud and the current line portion; and
connecting the strap portion of the interconnecting device to the junction strap of said magnetic tunnel junction of the first MRAM cells so that the interconnecting device is connected in series to the plurality of MRAM cells.

6. The method according to claim 5,
wherein forming the lower metallic stud comprises forming a first dielectric layer on a substrate and forming a lower stud trench in the first dielectric layer; the lower metallic stud being deposited in the lower stud trench.

7. The method according to claim 5,
wherein forming the strap portion comprises forming a second dielectric layer on first dielectric layer and forming a third dielectric layer on second dielectric layer; forming a strap trench in the third dielectric layer and depositing the strap portion in said strap trench.

8. The method according to claim 7,
wherein forming the via comprises forming a fourth dielectric layer on third dielectric layer;
forming a via trench in the fourth dielectric layer aligned with the lower metallic stud; and
depositing the via in the via trench.

9. The method according to claim 8,
further comprising forming a junction trench in the fourth dielectric layer aligned with the strap portion; and depositing the magnetic tunnel junction in the junction trench.

10. The method according to claim 8,
wherein forming the upper metallic stud and a current line portion comprises forming a fifth dielectric layer on fourth dielectric layer; forming an upper stud trench aligned with the lower metallic stud and a line trench aligned with the magnetic tunnel junction in the fifth dielectric layer; and depositing the upper metallic stud in the upper stud trench and a current line portion in the line trench.

* * * * *